United States Patent
Mazzochette et al.

(10) Patent No.: US 7,777,235 B2
(45) Date of Patent: Aug. 17, 2010

(54) LIGHT EMITTING DIODES WITH IMPROVED LIGHT COLLIMATION

(75) Inventors: Joseph Mazzochette, Cherry Hill, NJ (US); Greg Blonder, Summit, NJ (US)

(73) Assignee: Lighting Science Group Corporation, Satellite Beach, FL (US)

(*) Notice: Subject to any disclaimer, the term of this patent is extended or adjusted under 35 U.S.C. 154(b) by 0 days.

(21) Appl. No.: 11/409,847

(22) Filed: Apr. 24, 2006

(65) Prior Publication Data

US 2007/0018175 A1 Jan. 25, 2007

Related U.S. Application Data

(63) Continuation-in-part of application No. 10/638,579, filed on Aug. 11, 2003, now Pat. No. 7,095,053.

(60) Provisional application No. 60/467,857, filed on May 5, 2003.

(51) Int. Cl.
*H01L 33/00* (2010.01)
(52) U.S. Cl. ............... 257/81; 257/13; 257/79; 257/82; 257/103; 257/95; 257/98; 257/99; 257/100; 257/E51.018; 257/E51.022; 257/E33.001; 257/E25.028; 257/E25.032
(58) Field of Classification Search ............ 257/13, 257/79–103, 918, E51.018, E51.022, E33.054, 257/E25.028
See application file for complete search history.

(56) References Cited

U.S. PATENT DOCUMENTS

| | | |
|---|---|---|
| 3,711,789 A | 1/1973 | Dierschke |
| 4,886,709 A | 12/1989 | Sasame et al. |
| 4,902,567 A | 2/1990 | Eilertsen et al. |
| 5,117,281 A | 5/1992 | Katsuraoka |
| 5,122,781 A | 6/1992 | Saubolle |
| 5,136,483 A * | 8/1992 | Schoniger et al. ........... 362/545 |
| 5,140,220 A | 8/1992 | Hasegawa |
| 5,235,347 A | 8/1993 | Lee et al. |
| 5,441,774 A | 8/1995 | Dutta et al. |
| 5,482,898 A | 1/1996 | Marrs |
| 5,485,037 A | 1/1996 | Marrs |
| 5,581,876 A | 12/1996 | Prabhu et al. |
| 5,674,554 A | 10/1997 | Liu et al. |
| 5,725,808 A | 3/1998 | Tormey et al. |

(Continued)

FOREIGN PATENT DOCUMENTS

DE 19625622 1/1998

(Continued)

*Primary Examiner*—Wael Fahmy
*Assistant Examiner*—Marc Armand
(74) *Attorney, Agent, or Firm*—Cantor Colburn LLP

(57) ABSTRACT

A light emitting diode with improved light collimation comprises a substrate-supported LED die disposed within a transparent dome. A portion of the dome laterally circumscribe the die comprises light reflecting material to reflect emitted light back to the die. A portion of the dome centrally overlying the die is substantially free of light reflecting material to permit exit of light within a desired radiation pattern. The LED die may be packaged for high temperature operation by disposing them on a ceramic-coated metal base which can be coupled to a heat sink. The packaged LED can be made by the low temperature co-fired ceramic-on-metal technique (LTCC-M).

24 Claims, 2 Drawing Sheets

U.S. PATENT DOCUMENTS

| | | | |
|---|---|---|---|
| 5,745,624 A | 4/1998 | Chan et al. | |
| 5,841,244 A | 11/1998 | Hamilton et al. | |
| 5,847,507 A | 12/1998 | Butterworth et al. | |
| 5,847,935 A * | 12/1998 | Thaler et al. | 361/761 |
| 5,857,767 A | 1/1999 | Hochstein | |
| 5,907,151 A * | 5/1999 | Gramann et al. | 250/214.1 |
| 5,908,155 A | 6/1999 | Duffy et al. | |
| 5,953,203 A | 9/1999 | Tormey et al. | |
| 5,959,316 A | 9/1999 | Lowery | |
| 5,977,567 A | 11/1999 | Verdiell | |
| 5,998,925 A | 12/1999 | Shimizu et al. | |
| 6,016,038 A | 1/2000 | Mueller et al. | |
| 6,045,240 A | 4/2000 | Hochstein | |
| 6,066,861 A | 5/2000 | Hohn et al. | |
| 6,069,440 A | 5/2000 | Shimizu et al. | |
| 6,137,224 A | 10/2000 | Centofante | |
| 6,220,722 B1 | 4/2001 | Begemann | |
| 6,224,216 B1 | 5/2001 | Parker et al. | |
| 6,245,259 B1 | 6/2001 | Hohn et al. | |
| 6,259,846 B1 | 7/2001 | Roach et al. | |
| 6,277,301 B1 | 8/2001 | Hohn et al. | |
| 6,325,524 B1 | 12/2001 | Weber et al. | |
| 6,376,268 B1 | 4/2002 | Verdiell | |
| 6,417,019 B1 | 7/2002 | Mueller et al. | |
| 6,428,189 B1 | 8/2002 | Hochstein | |
| 6,455,930 B1 | 9/2002 | Palanisamy et al. | |
| 6,478,402 B1 | 11/2002 | Greive et al. | |
| 6,480,389 B1 | 11/2002 | Shie et al. | |
| 6,483,623 B1 | 11/2002 | Maruyama | |
| 6,498,355 B1 | 12/2002 | Harrah et al. | |
| 6,517,218 B2 | 2/2003 | Hochstein | |
| 6,518,502 B2 | 2/2003 | Hammond et al. | |
| 6,565,239 B2 | 5/2003 | Rizkin et al. | |
| 6,576,488 B2 | 6/2003 | Collins, III et al. | |
| 6,576,930 B2 | 6/2003 | Reeh et al. | |
| 6,577,073 B2 | 6/2003 | Shimizu et al. | |
| 6,592,780 B2 | 7/2003 | Hohn et al. | |
| 6,608,332 B2 | 8/2003 | Shimizu et al. | |
| 6,613,247 B1 | 9/2003 | Hohn et al. | |
| 6,614,179 B1 | 9/2003 | Shimizu et al. | |
| 6,622,948 B1 | 9/2003 | Haas et al. | |
| 6,627,115 B2 | 9/2003 | Hampden-Smith et al. | |
| 6,630,691 B1 | 10/2003 | Mueller-Mach et al. | |
| 6,634,750 B2 | 10/2003 | Neal et al. | |
| 6,634,770 B2 | 10/2003 | Cao | |
| 6,682,207 B2 | 1/2004 | Weber et al. | |
| 6,692,252 B2 | 2/2004 | Scott | |
| 6,727,643 B2 * | 4/2004 | Suehiro | 313/499 |
| 6,734,465 B1 | 5/2004 | Taskar et al. | |
| 6,747,293 B2 | 6/2004 | Nitta et al. | |
| 6,791,119 B2 | 9/2004 | Slater, Jr. et al. | |
| 6,793,374 B2 | 9/2004 | Begemann et al. | |
| 6,812,500 B2 | 11/2004 | Reeh et al. | |
| 6,827,469 B2 | 12/2004 | Coushaine et al. | |
| 6,831,302 B2 | 12/2004 | Erchak et al. | |
| 6,833,669 B2 | 12/2004 | George et al. | |
| 6,866,394 B1 | 3/2005 | Hutchins et al. | |
| 6,874,910 B2 | 4/2005 | Sugimoto et al. | |
| 6,885,035 B2 | 4/2005 | Bhat et al. | |
| 6,943,380 B2 | 9/2005 | Ota et al. | |
| 6,964,877 B2 | 11/2005 | Chen et al. | |
| 6,982,829 B1 | 1/2006 | Berman | |
| 7,015,514 B2 * | 3/2006 | Baur et al. | 257/100 |
| 7,033,060 B2 | 4/2006 | Dubuc et al. | |
| 7,095,053 B2 | 8/2006 | Mazzochette et al. | |
| 7,098,483 B2 | 8/2006 | Mazzochette et al. | |
| 7,235,189 B2 | 6/2007 | Hohn et al. | |
| 7,276,736 B2 | 10/2007 | Hohn et al. | |
| 2001/0030326 A1 | 10/2001 | Reeh et al. | |
| 2002/0004251 A1 | 1/2002 | Roberts et al. | |
| 2002/0034834 A1 | 3/2002 | Verdiell | |
| 2002/0084749 A1 * | 7/2002 | Ayala et al. | 313/512 |
| 2002/0135039 A1 * | 9/2002 | Yang | 257/499 |
| 2002/0163006 A1 | 11/2002 | Yoganandan et al. | |
| 2002/0175621 A1 | 11/2002 | Song et al. | |
| 2002/0176250 A1 | 11/2002 | Bohler et al. | |
| 2003/0010993 A1 | 1/2003 | Nakamura et al. | |
| 2003/0025485 A1 | 2/2003 | McTigue | |
| 2003/0057421 A1 | 3/2003 | Chen | |
| 2003/0077385 A1 | 4/2003 | Ainsworth et al. | |
| 2003/0156608 A1 | 8/2003 | Ido et al. | |
| 2003/0189830 A1 * | 10/2003 | Sugimoto et al. | 362/294 |
| 2003/0193055 A1 | 10/2003 | Martter et al. | |
| 2003/0201451 A1 * | 10/2003 | Suehiro et al. | 257/98 |
| 2004/0026706 A1 | 2/2004 | Bogner et al. | |
| 2004/0223315 A1 * | 11/2004 | Suehiro et al. | 362/84 |
| 2005/0088625 A1 | 4/2005 | Imade | |
| 2005/0168147 A1 | 8/2005 | Innocenti et al. | |
| 2005/0189557 A1 | 9/2005 | Mazzochette et al. | |
| 2005/0225222 A1 | 10/2005 | Mazzochette et al. | |
| 2005/0270666 A1 | 12/2005 | Loh et al. | |
| 2006/0006405 A1 | 1/2006 | Mazzochette | |
| 2006/0105484 A1 | 5/2006 | Basin et al. | |

FOREIGN PATENT DOCUMENTS

| | | |
|---|---|---|
| DE | 19638667 | 4/1998 |
| EP | 0862794 | 9/1998 |
| EP | 0936682 | 8/1999 |
| EP | 1017112 | 7/2000 |
| EP | 1221724 | 7/2002 |
| JP | 10-012926 | 1/1998 |
| JP | 2000-294701 | 10/2000 |
| WO | WO-97/50132 | 12/1997 |
| WO | WO-98/05078 | 2/1998 |
| WO | WO-98/12757 | 3/1998 |

* cited by examiner

LIGHT EMITTING DIODES WITH IMPROVED LIGHT COLLIMATION

CROSS REFERENCE TO RELATED APPLICATIONS

This is a continuation-in-part of U.S. patent application Ser. No. 10/638,579, filed on Aug. 11, 2003, now U.S. Pat. No. 7,095,053 which in turn claims the benefit of U.S. Provisional Application Ser. No. 60/467,857, filed on May 5, 2003. The 10/638,579 and 60/467,857 applications are incorporated by reference herein.

FIELD OF THE INVENTION

This invention relates to light emitting diodes and, in particular, to light emitting diodes packaged to provide a light beam of enhanced collimation. Such LEDs are particularly useful as light sources in image projection systems.

BACKGROUND OF THE INVENTION

Light emitting diodes (LEDs) are being used as light sources in an increasing variety of applications extending from communications and instrumentation to household illumination, automotive lighting and image projection systems. In image projection systems, LEDs have many advantages over conventional high intensity discharge lamps (HID lamps). LEDs operate at lower temperatures than HID lamps, do not require pressurized mercury vapor, and are safer and more reliable in use.

Unfortunately for several applications, including image projection, the light output from conventionally packaged LED die is relatively unfocused in that it emits from the LED at a wide angle. For a typical LED source, the output light is at least one-half the peak power over an angle of about 120°. However only the light within about 12° of the center (an angle of about)24° is useful in typical image projection systems.

FIG. 1, which is a schematic cross section of a conventional LED 10 illustrates the problem to which the present invention is directed. The LED 10 comprises an LED die 11 mounted on a base 12 and encapsulated in a transparent material such as an epoxy dome 13. The die 11 can be mounted within a surface cavity (not shown).

As illustrated, light rays 14 will leave die 11 over a wide angular range of approximately 120°. The range may be slightly narrowed by an encapsulant dome 13 shaped to act as a lens. But much of the light 14 falls outside of the relatively narrow radiation pattern, within which emitted light may usefully be employed by a typical image projection system, such as a radiation pattern, 15 as shown in FIG. 1.

Efforts have been made to reduce the spatial extent of LED light sources by the use of optical devices such as reflectors and lens optics. However, this approach does not improve the entendue of the light source as measured by the product of the source emission area and the light emission angle. Accordingly, there is a need for light emitting diodes with improved light collimation.

SUMMARY OF THE INVENTION

In accordance with the invention, a LED assembly packaged for improved light collimation is provided. The assembly comprises a thermally conductive base, at least one LED die mounted on the base and a transparent encapsulant covering the LED die. The encapsulant includes a first region of reflective material circumscribing and overlying the die to reflect back to the die light emitted from the die. The encapsulant also includes a second region centrally overlying the die substantially free of the reflective material to permit exit of light within a desired field. In advantageous embodiments, the LED die are packaged for high temperature operation by disposing them on a ceramic-coated metal base which can be coupled to a heat sink. The packaged LED can be made by the low temperature co-fired ceramic-on-metal technique (LTCC-M).

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that the drawings are to illustrate the concepts of the invention and may not be to scale.

DETAILED DESCRIPTION OF THE DRAWINGS

This description is divided into two parts. Part I describes the structure for improving light collimation and Part II illustrates features of an advantageous LTCC-M package.

I. Light Collimating Structure

Figure 1:
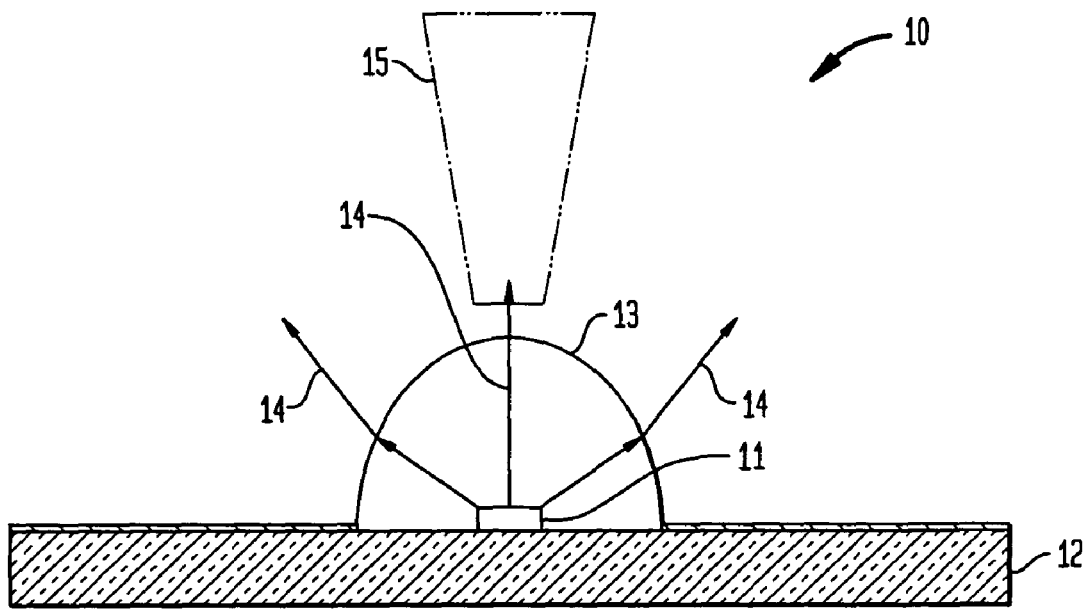
FIG. 1 is a schematic cross section of a conventionally packaged LED assembly useful in understanding the problem to which the invention is addressed.
Figure 2:
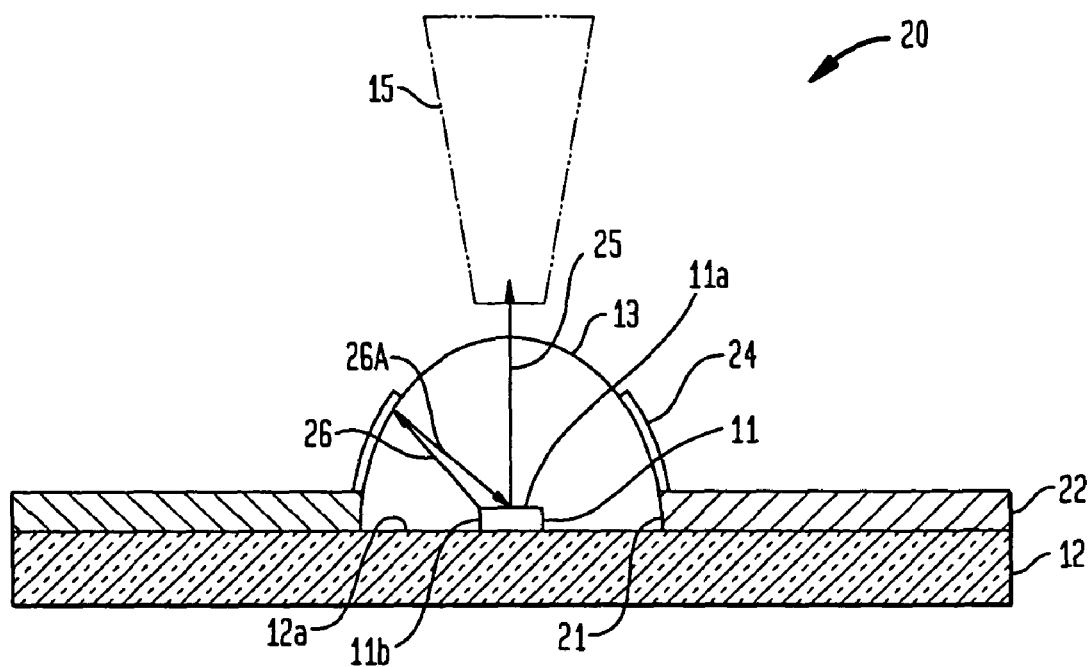
FIG. 2 is a schematic cross section of an LED assembly packaged to provide a light beam with enhanced collimation in accordance with an embodiment of the present invention.

FIG. 2 is a schematic cross section of a light emitting diode (LED) assembly 20 packaged to provide a light beam of enhanced collimation. The LED assembly 20 comprises one or more LED die 11 mounted on a base 12. The die 11 is conveniently encapsulated within a transparent encapsulant, preferably an epoxy dome 13. The die 11 may be mounted within a surface cavity 21. Advantageously, the base 12 comprises ceramic-coated metal with ceramic coating 22 overlying the metal base 12. The ceramic-coated metal base is advantageously made by the LTCC-M technique described in part II herein.

The LED 1 of FIG. 2 may be provided with reflective and/or dispersive surfaces. The top surface 11a and/or the side surface 11b of the die 11 can preferably be made dispersive by a roughening process such as etching or milling, or more reflective by polishing or coating. In addition, or alternatively, the surface 12a of the mounting base 12 covered by the dome 13 may preferably be made dispersive or more reflective. Polishing and roughening can be achieved using diamond or aluminum oxide powder or other known abrasives/polishing grits. A coarse grit is used for roughening and a fine grit for polishing. The surface is polished or made dispersive to improve light extraction from the LED assembly package.

Additionally, a region of the dome 13, laterally circumscribing the die, is preferably provided with a circumscribing reflective surface 24. This region of the dome 13 is masked and coated with reflective material to form the reflective surface 24 as shown in FIG. 2.

While it is desirable that the reflective surface 24 be coated around the perimeter of the encapsulant material of dome 13, it is not necessary that the encapsulant be dome shaped or that the reflective surface completely circumscribe the encapsulant. A circumscribing reflector could be coated on even a planar encapsulant overlying the die 11. Moreover a circumscribing reflector could also be coated on an added dome (e.g. a glass dome) overlying an encapsulant.

In operation, as shown in FIG. 2, much of transversely-oriented light, such a light ray 25, emitted by the die will fall within a desired acceptance angle of a projector system such as a acceptance radiation pattern 15. Much of the peripherally-oriented light, such as light ray 26, emitted by the die will impinge on the circumscribing reflective surface 24. When the surface 11a of the die 11 is rough, rays such as 26A will not follow Snell's law (angle of incidence equals angle of reflection), but instead will tend to be more likely to scatter from the die surface 11a into the direction of ray 25, and thus within the radiation pattern 15. Thus, some of the reflected light 26A will be reflected back to the die 11, and the light energy will be reflected out or recycled as additional emitted light. Thus the reflective surface 24 recycles light outside the radiation pattern 15 into additional light emitted by the LED within the cone.

In an alternate embodiment of the present invention, the surfaces 11a and 11b of the LED 11 and/or surface 12a of the mounting base 12 can preferably be coated with nano-crystals roughening the LED 11 which would function in a similar way as the surface roughening of the LED 11. Such nano-crystals may be made of a high index of refraction material such as titanium oxide. The nano-crystals may also be made from fused silica, or lead borosilicate glass. The nano-crystals having high index of refraction compared to the material surrounding it will improve the light extraction from the package assembly. Furthermore, the nano-crystals act as a diffuser changing the direction of the light to preferably collimate and fall within the radiation pattern 15. Similar to the operation shown in FIG. 2, the light 26 produced by the LED 11 that is not emitted within the acceptance radiation pattern of the projector system would be reflected as light ray 26A from the reflective surface 24, back into the nano-crystal treated surface of the LED 11, and then back within the radiation pattern 15 as a light ray similar to light ray 25.

The invention can now be more clearly understood by consideration of the following example.

EXAMPLE

The assembly of FIG. 2 can be fabricated by forming the base and cavity using the LTCC-M technique described in Part II herein. The encapsulant dome 13 can be formed using an encapsulant such as Dymax 9615 epoxy. The peripheral reflecting surface 24 can be formed by the vacuum evaporation of an aluminum film using methods well known in the art.

II. LTCC-M Packaging

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750-950° C. The composition of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Where optical components, such as LEDs are installed, the walls of the ceramic layers can be shaped and/or coated to enhance the reflective optical properties of the package. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure are advantageously matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, *"Integrated heat sinking packages using low temperature co-fired ceramic metal circuit board technology"*, issued Sep. 24, 2002 to Ponnuswamy, et al and assigned to Lamina Ceramics. U.S. Pat. No. 6,455,930 is incorporated by reference herein. The LTCC-M structure is further described in U.S. Pat. Nos. 5,581,876, 5,725,808, 5,953,203, and 6,518502, all of which are assigned to Lamina Ceramics and also incorporated by reference herein.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

Figure 3:
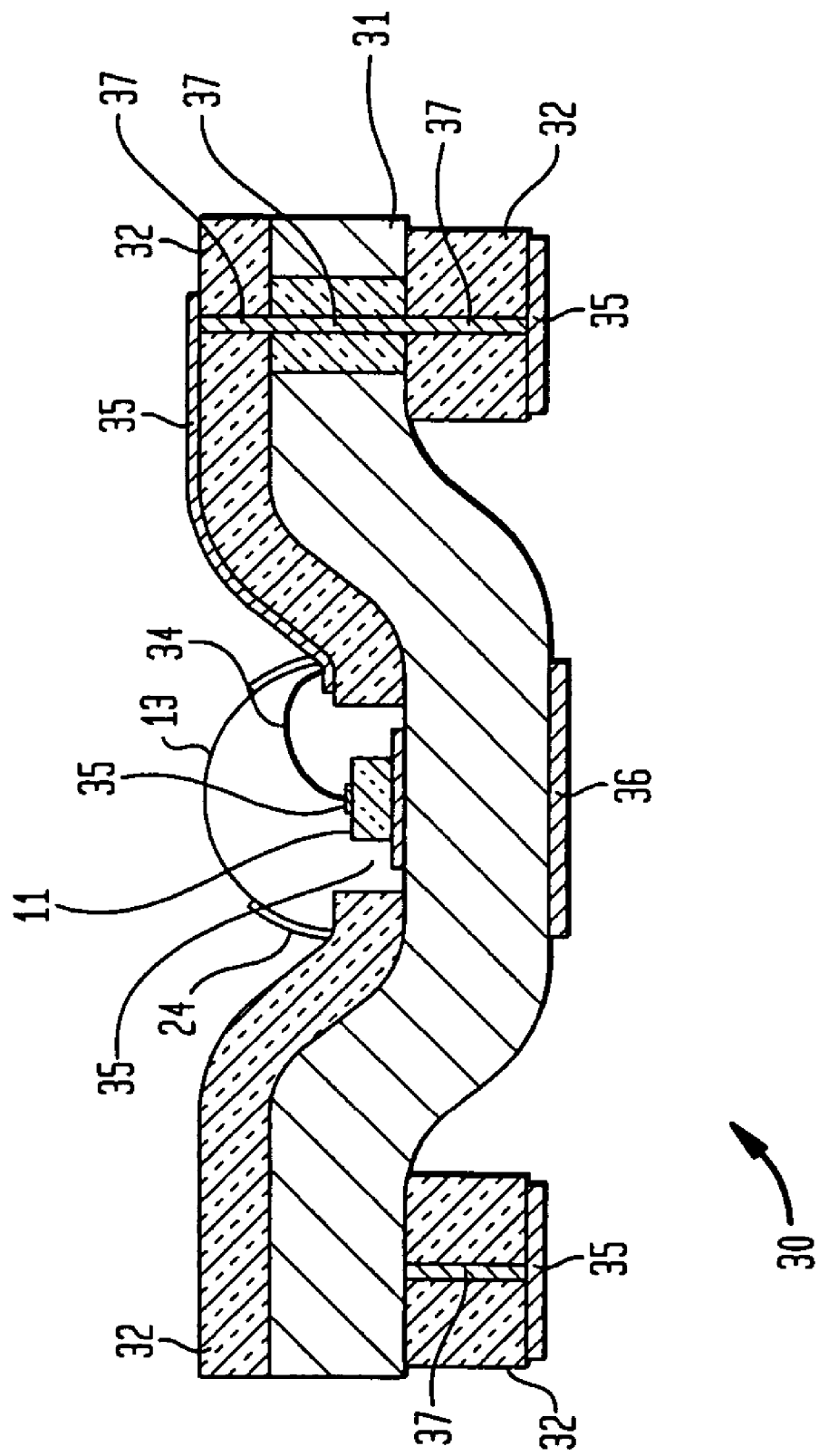
FIG. 3 is a schematic cross section illustrating various advantageous features of LTCC-M packaging in accordance with an embodiment of the present invention.

In the simplest form of the present invention, LTCC-M technology is used to provide an integrated package for an LED die and accompanying circuitry, wherein the conductive metal support board provides a heat sink for the component. Referring to FIG. 3, there is shown a schematic cross-section of the LTCC-M packaging 30 including a bare LED die 11, for example, can be mounted directly onto a metal base 31. The metal base is coated with LTCC 32. LTCC-M system having high thermal conductivity to cool the semiconductor component. In such case, the electrical signals to operate the component can be connected to the die 11 from the LTCC 32.

In FIG. 3, wire bond 34 serves this purpose. Indirect attachment to the metal support board can also be used. In this package, all of the required components are mounted on a metal support board, incorporating passive components such as bonding pads (pair of electrodes) 35, thermal connector pads 36 and conductive vias 37 and resistors into the multilayer ceramic portion, to connect the various components, i.e., semiconductor components, circuits, heat sink and the like, in an integrated package. The pair of electrodes 35 are electrically connected to the metal base 31 with the wire bond 34. These electrodes 35 overlying the base 31 are electrically insulated from the base 31 by being electrically connected to the vias 37, which are insulated from the base 31. The package can be hermetically sealed with the clear encapsulant forming dome 13 and supporting the peripheral reflecting surface 24.

For a more complex structure having improved heat sinking, the integrated package of the invention combines a first and a second LTCC-M substrate. The first substrate can have mounted thereon a semiconductor device, and a multilayer ceramic circuit board with embedded circuitry for operating the component; the second substrate has a heat sink or conductive heat spreader mounted thereon. Thermoelectric (TEC) plates (Peltier devices) and temperature control circuitry are mounted between the first and second substrates to provide improved temperature control of semiconductor devices. A hermetic enclosure can be adhered to the metal support board.

The use of LTCC-M technology can also utilize the advantages of flip chip packaging together with integrated heat sinking. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs can be used with this new LTCC-M technology.

It can now be seen that one aspect of the invention is a light emitting diode packaged for improved light collimation comprising a substrate-supported LED die encapsulated within a transparent encapsulant. The packaged die includes a reflecting structure circumscribing and overlying the die to reflect back to the die light that is laterally emitted from the die. The encapsulant region overlying the die is substantially free of light reflecting material and permits exit of light within a reduced angle. Advantageously, the reflecting structure comprises a region of the encapsulant coated with reflective material. Also advantageously, the reflecting structure comprises a transparent dome overlying the die, a portion of the dome circumscribing the die coated with reflecting material. Desirably, the transparent dome comprises the encapsulant, but it can be an added component.

The LED die surface is advantageously roughened to provide a dispersive surface, coated with a layer of nano-crystals, or polished or coated to provide a reflective surface. In a particularly advantageous embodiment, the substrate-supported LED die comprises a ceramic-coated metal substrate, and the die is mounted in a surface cavity formed by an opening in the ceramic.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A LED assembly packaged for improved light collimation comprising:
    a thermally conductive base;
    at least one LED die mounted on the base;
    a transparent encapsulant covering each of the at least one LED die, the transparent encapsulant comprising a first region and a second region; and
    a reflective material conforming to the shape of the transparent encapsulant, and formed over the first region at a lower periphery of the transparent encapsulant, the reflective material laterally circumscribing the respective LED die, to reflect back toward the respective LED die peripherally-oriented light emitted by the respective LED die,
    wherein the second region is centrally overlying the respective LED die and free of the reflective material to permit exit of light from the respective LED die within a desired light emission field.

2. The assembly of claim 1 wherein the transparent encapsulant comprises an epoxy dome, and the reflective material comprises a reflective film overlying the epoxy dome.

3. The assembly of claim 1 wherein said reflective material restricts emission of light substantially within a desired radiation pattern.

4. The assembly of claim 1 wherein the base comprises a metal layer and at least one ceramic layer disposed on the metal layer.

5. The assembly of claim 1, wherein the LED die has a rough surface.

6. The assembly of claim 1 wherein at least one of a surface of the LED die or surface of the base covered by the transparent encapsulant comprises an etched or milled surface.

7. The assembly of claim 1 wherein the LED die has a polished surface.

8. The assembly of claim 1 further comprising light-diffusive nano-crystals disposed on the LED die.

9. The assembly of claim 3, wherein the base comprises a surface cavity comprising an opening in the ceramic layer, and the die is mounted within said cavity.

10. The assembly of claim 3, wherein the radiation pattern restricts emitted light substantially to a beam angle of 25° or less.

11. The assembly of claim 3 wherein the radiation pattern restricts emitted light substantially to a beam angle of 12° or less.

12. The assembly of claim 8 where said light-diffusive nano-crystals comprise a material selected from a group consisting of silica, silicon, titanium oxide, indium oxide, tine oxide or combination thereof.

13. A LED assembly packaged for improved light collimation comprising:
    a low temperature co-fired ceramic-on-metal (LTCC-M) base, the base including a surface cavity;
    at least one LED die mounted within the cavity;
    a transparent encapsulant covering each of the at least one LED die, the transparent encapsulant comprising a first region and a second region; and
    a reflective material conforming to the shape of the transparent encapsulant, and formed over the first region at a lower periphery of the transparent encapsulant, the reflective material laterally circumscribing the respective LED die, to reflect back toward the respective LED die peripherally-oriented light emitted by the respective LED die, wherein the second region is centrally overlying the respective LED die and free of the reflective material to permit exit of light from the respective LED die within a desired light emission field.

14. The assembly of claim 13 wherein the transparent encapsulant comprises an epoxy dome, and the reflective material comprises a reflective film overlying the epoxy dome.

15. The assembly of claim 13 wherein the reflective material restricts emission of light within a desired radiation pattern.

16. The assembly of claim 13 wherein the LED die has a rough surface.

17. The assembly of claim 13 wherein at least one of a surface of the LED die or surface of the base covered by the transparent encapsulant comprises an etched or milled surface.

18. The assembly of claim 13 wherein the LED further comprises a polished LED die surface.

19. The assembly of claim 13 further comprising light-diffusive nano-crystals disposed on the LED die.

20. The assembly of claim 13 wherein each of the at least one LED die comprises a pair of electrode overlying and electrically insulated from the metal base.

21. The assembly of claim 13 further comprising thermal connective pads mounted to the base to dissipate heat from the LED die.

22. The assembly of claim 19 wherein said light-diffusive nano-crystals comprise a material selected from a group consisting of silica, silicon, titanium oxide, indium oxide, tin oxide or combinations thereof.

23. The assembly of claim 20 further comprising conductive vias insulated from the metal base wherein the electrodes are electrically connected to the vias.

24. The assembly of claim 23 further comprising wire bonds electrically connecting the electrodes to the base.

* * * * *